(12) United States Patent
Kuribara

(10) Patent No.: US 7,560,693 B2
(45) Date of Patent: Jul. 14, 2009

(54) ELECTRON-BEAM SIZE MEASURING APPARATUS AND SIZE MEASURING METHOD WITH ELECTRON BEAMS

(75) Inventor: Masayuki Kuribara, Tokyo (JP)

(73) Assignee: Advantest Corp., Tokyo (JP)

( * ) Notice: Subject to any disclaimer, the term of this patent is extended or adjusted under 35 U.S.C. 154(b) by 276 days.

(21) Appl. No.: 11/820,358

(22) Filed: Jun. 19, 2007

(65) Prior Publication Data
US 2008/0067383 A1    Mar. 20, 2008

(30) Foreign Application Priority Data
Jun. 22, 2006 (JP) ............... 2006-172386

(51) Int. Cl.
*G21K 7/00* (2006.01)
(52) U.S. Cl. .............. 250/311; 250/310; 250/307; 250/306; 250/399; 250/397
(58) Field of Classification Search .......... 250/310, 250/306, 307, 309, 311, 442.11, 397, 398, 250/399, 400
See application file for complete search history.

(56) References Cited

U.S. PATENT DOCUMENTS

| | | | | |
|---|---|---|---|---|
| 5,412,209 | A * | 5/1995 | Otaka et al. ............. | 850/9 |
| 6,107,637 | A | 8/2000 | Watanabe et al. | |
| 6,365,896 | B1 * | 4/2002 | van der Mast ........... | 250/310 |
| 7,019,294 | B2 * | 3/2006 | Koyama et al. .......... | 250/311 |
| 2001/0011702 | A1 * | 8/2001 | Yonezawa et al. ........ | 250/283 |
| 2004/0211913 | A1 * | 10/2004 | Petrov .................. | 250/396 R |
| 2005/0001165 | A1 * | 1/2005 | Parker ................. | 250/310 |
| 2005/0127294 | A1 * | 6/2005 | Katane et al. ........... | 250/311 |
| 2006/0016990 | A1 * | 1/2006 | Suzuki et al. ........... | 250/310 |
| 2006/0186337 | A1 * | 8/2006 | Hatano et al. ........... | 250/310 |
| 2007/0057183 | A1 | 3/2007 | Arai et al. | |
| 2009/0065694 | A1 * | 3/2009 | Arai et al. ............. | 250/310 |

FOREIGN PATENT DOCUMENTS

| | | |
|---|---|---|
| JP | 05-135726 | 6/1993 |
| JP | 11-250847 | 9/1999 |
| JP | 2003-142019 | 5/2003 |
| JP | 2006-54094 | 2/2006 |

* cited by examiner

*Primary Examiner*—David A Vanore
*Assistant Examiner*—Michael J Logie
(74) *Attorney, Agent, or Firm*—Muramatsu & Associates

(57) ABSTRACT

An electron-beam size measuring apparatus includes: electron beam irradiating means that irradiates an electron beam on a surface of a sample; detection means that detects electrons emitted from the sample; distance measurement means that measures the distance between the sample and a secondary electron control electrode of the detection means; a stage on which the sample is mounted; and control means which adjusts the height of the stage so that the distance measured by the distance measurement means would be equal to a predetermined fixed distance, which applies a control voltage to the secondary electron control electrode of the detection means, the control voltage predetermined so as to allow the sample surface potential to become constant with the sample positioned at the fixed distance, and which causes the electron beam to be irradiated by applying a predetermined accelerating voltage. The stage may include holding means that does not electrically connect the sample thereto, and moving means that moves the sample up and down.

12 Claims, 10 Drawing Sheets

ELECTRON-BEAM SIZE MEASURING APPARATUS AND SIZE MEASURING METHOD WITH ELECTRON BEAMS

CROSS-REFERENCE TO RELATED APPLICATIONS

This application is based on and claims priority of Japanese Patent Application No. 2006-172386 filed on Jun. 22, 2006, the entire contents of which are being incorporated herein by reference.

BACKGROUND OF THE INVENTION

1. Field of the Invention

The present invention relates to an electron-beam size measuring apparatus and a size measuring method with electron beams for inspecting a sample by irradiating an electron beam onto the sample.

2. Description of the Prior Art

During processing of manufacturing a semiconductor device, an inspection of a sample, a measurement of a pattern line width and the like are carried out with an electron beam apparatus such as an electron microscope. In an inspection or measurement of a sample, a portion to be inspected is scanned while being irradiated with an electron beam, and is displayed as an image on a display device by converting the amount of secondary electrons or the like to luminance.

When a sample is inspected or measured in this way, the sample is irradiated with an electron beam. This irradiation with the electron beam brings about a phenomenon in which a surface of the sample becomes charged. More specifically, the irradiated surface becomes charged positively or negatively by a difference in the amount of charge between charged particles entering the sample and charged particles emitted from the sample. When the surface of the sample is charged, emitted secondary electrons are accelerated or drawn back to the sample, and thus the efficiency of secondary electron emission is changed. This consequently produces a problem that image quality of the sample surface becomes unstable. In addition, when the charging of the sample surface progresses, the primary electron beam may be deflected, thereby causing a distortion in an image, in some cases.

To solve such problems, various methods for preventing a sample surface from being charged have been proposed.

As a technique relating to this, Japanese Patent Application Laid-open Publication No. 2003-142019 discloses a method for controlling charging of a sample surface by using an accelerating voltage making a secondary electron yield more than 1 and an accelerating voltage making the secondary electron yield less than 1. Moreover, Japanese Patent Application Laid-open Publication No. 2006-54094 discloses a method for preventing the potential of a sample surface from becoming positive in a way that a voltage from an electrode disposed right above the sample pushes back secondary electrons emitted from the sample surface.

As described above, there occurs a phenomenon in which a sample becomes charged during an inspection of the sample with an electron beam apparatus. However, in a case where a sample can be electrically connected like a wafer, for example, there are no particular problems because a charging phenomenon of the sample can be prevented by grounding a conductor on the wafer electrically connected.

However, a charging phenomenon of a sample occurs in a case where the sample is nonconductive, or where the sample is electrically floating without being grounded even though the sample is made of a conductive material.

For example, in a case of measuring a dimension of a photo mask, which is to be used as a master for exposing a semiconductor, charging occurs in the following two statuses. In a first status, a conductor such as chrome is disposed over an entire surface of a glass substrate during processing of fabricating a wiring, and is covered with a resist wiring for etching the chrome to form the wiring. In a second status, the wiring made of the conductor such as chrome is disposed on the glass substrate after completion of the processing of fabricating the wiring.

The layer made of the conductor such as chrome is disposed over the entire surface of the glass substrate immediately before the chrome is etched, in particular. For this reason, when a certain portion becomes charged due to irradiation with an electron beam, the conductive layer over the entire surface of the substrate is charged. This consequently influences an inspection or dimensional measurement of another portion. In addition, even when charging at one portion is small, charging eventually becomes large by irradiating several hundreds to several thousands portions with the electron beam, which makes it impossible to figure out a dimensional relationship between a dimension measured first and a dimension measured last.

In regard to such a change in measured dimension, an experiment of the present inventor revealed that, in a case where the irradiation energy of an electron beam is 1500 (eV), for example, a change of sample surface potential of 10 (V) causes a dimension of 2 ($\mu$m) to vary by 6 (nm).

Compared with this, it is required that an electron-beam size measuring apparatus should have dimensional accuracy within an error range of not more than 1 (nm) when measuring a dimension of 2 ($\mu$m). Accordingly, in the case of the irradiation energy of 1500 (eV), an allowable range of a change of sample surface potential is on the order of 1.7 (V).

In addition, in a case of dimensional measurement of a resist material used during processing of forming wiring, the irradiation energy of an electron beam is generally lowered down to approximately 500 (eV) for the purpose of avoiding a damage of the resist material. In this case, the change of sample surface potential must be set equal to or less than approximately 0.6 (V) in order to satisfy the requirement for the dimensional accuracy.

Moreover, since some types of resist materials have high damage sensitivity to an electron beam, the irradiation energy must be lowered down to approximately 400 (eV) to 300 (eV), and it is desirable that a change of sample surface potential be close to 0 (V) as much as possible.

Note that it is difficult to maintain sample surface potential fixed with accuracy of not more than 1 (V) with a method for controlling charging of a sample surface by using secondary electrons.

SUMMARY OF THE INVENTION

The present invention has been made in consideration of the problems of the conventional techniques. An object of the present invention is to provide an electron-beam size measuring apparatus and a size measuring method with electron beams with which a sample can be measured with high accuracy while keeping the sample surface potential fixed within a range of not more than 1 (V).

The foregoing problems can be solved by an electron-beam size measuring apparatus including electron beam irradiating means, detection means, distance measurement means, a stage and control means. Specifically, the electron beam irradiating means irradiates an electron beam on a surface of a sample. The detection means detects electrons emitted from the sample. The distance measurement means measures the distance between the sample and a secondary electron control electrode of the detection means. On the stage, the sample is mounted. Then, the control means adjusts the height of the stage so that the distance measured by the distance measurement means would be equal to a predetermined fixed distance, applies a predetermined control voltage to the secondary electron control electrode of the detection means, and causes the electron beam to be irradiated by applying a predetermined accelerating voltage. Here, the control voltage is predetermined so as to allow the sample surface potential to become constant with the sample positioned at the fixed distance.

In the aforementioned electron-beam size measuring apparatus, the control voltage may be a voltage predetermined by using a calibration sample made of the same material as that of the sample. To be more precise, assume that a first measured value is obtained by measuring a dimension of the calibration sample with the surface thereof not charged, and that a second measured value is a value at a time when the measured value of the calibration sample does not vary any more, while the calibration sample is irradiated with the electron beam and is measured in dimension, alternately, from a state in which the surface of the calibration sample is charged at the beginning. Upon this assumption, the value is determined as a value at a time when the first measured value and the second measured value become equal to each other.

In addition, in the electron-beam size measuring apparatus, the control means may cause the electron beam irradiating means to irradiate the electron beam on the entire surface of the sample with, or on an area to which a conductor on the sample is exposed.

Moreover, the foregoing problems can be solved by using a size measuring method with electron beams including the steps of: figuring out a control voltage to be applied to a secondary electron control electrode for adjusting the charge potential of the sample to become constant when the distance between a sample and the secondary electron control electrode is kept fixed, and also when an accelerating voltage for an electron beam to be irradiated on the sample is set to a predetermined value; adjusting the distance between the sample and the secondary electron control electrode to be the predetermined distance; irradiating the sample with an electron beam at the accelerating voltage by applying the control voltage to the secondary electron control electrode; and measuring a dimension of the sample after irradiating the electron beam.

According to the present invention, the electron beam is irradiated by applying a predetermined voltage to the secondary electron control electrode under the condition that the distance between the surface of the sample to be measured and the secondary electron control electrode is set to the predetermined fixed value. The voltage applied to the secondary electron control electrode is a voltage adjusted so as to allow the sample surface potential to become constant when the distance between the surface of the sample and the secondary electron control electrode is set to the fixed value. By adjusting the distance between the surface of a sample and the secondary electron control electrode to be fixed, fixed force acts on electrons emitted from the surface of the sample, and the electrons emitted from the surface of the sample are drawn back to the surface thereof at a fixed ratio. This keeps the potential on a sample surface constant and thereby allows a trajectory of an electron beam and an irradiation area of the electron beam to be fixed.

DESCRIPTION OF THE PREFERRED EMBODIMENTS

Figure 1:
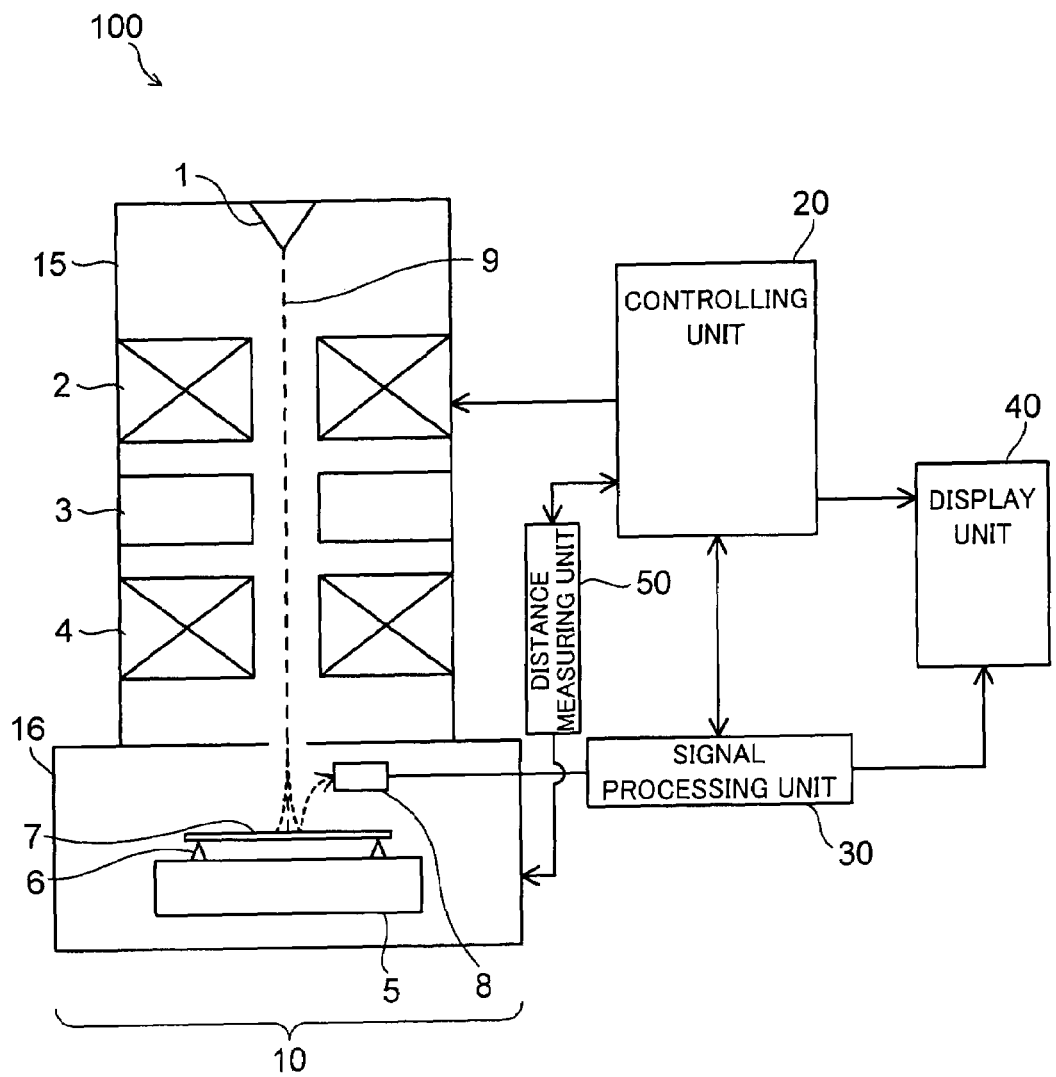
FIG. 1 is a configuration diagram of an electron-beam size measuring apparatus used in an embodiment of the present embodiment.

Hereinafter, an embodiment of the present invention will be described by referring to the drawings.

Firstly, a configuration of an electron-beam size measuring apparatus will be described. Secondly, descriptions will be provided for a process for adjusting the potential of a sample surface to be constant, which is a characteristic of the present invention. Thirdly, a size measuring method with electron beams using an electron-beam size measuring apparatus will be described. Lastly, descriptions will be given for an example in which dimensions were measured by using the size measuring method with electron beams of the present invention.

(Configuration of Electron-Beam Size Measuring Apparatus)

FIG. 1 is a configuration diagram of an electron-beam size measuring apparatus of the present embodiment.

This electron-beam size measuring apparatus 100 is roughly divided into an electronic scanning unit 10, a signal processing unit 30, a display unit 40, a distance measuring unit 50 and a controlling unit 20 that controls each of the electronic scanning unit 10, the signal processing unit 30, the display unit 40 and the distance measuring unit 50. Among them, the electronic scanning unit 10 is composed of an electron optical column unit 15 and a sample chamber 16.

The electron optical column unit 15 includes an electron gun (electron beam irradiating means) 1, a condenser lens 2, a deflecting coil 3 and an objective lens 4. The sample chamber 16 includes an XYZ stage 5 and a sample supporting unit 6 composed of an insulating material.

The sample chamber 16 is connected to both of a motor (not illustrated) for moving the XYZ stage 5 and an evacuator (not illustrated) for maintaining the inside of the sample chamber 16 in a predetermined reduced-pressure atmosphere.

A sample 7 above the XYZ stage 5 is to be irradiated with an electron beam 9 irradiated by the electron gun 1 through the condenser lens 2, the deflecting coil 3 and the objective lens 4.

When the sample 7 is irradiated with the electron beam 9, the amount of secondary electrons or reflected electrons emitted from the sample 7 is detected by an electron detector 8 composed of a secondary electron control electrode 8a, a scintillator and so on. In the signal processing unit 30, an AD converter converts the detected amount to a digital amount, and then to luminance signals. Thus, an image of the sample is displayed on the display unit 40. The controlling unit 20 controls the amount of electron deflection by the deflecting coil 3 and the amount of image scanning of the display unit 40.

The controlling unit 20 is composed of a microcomputer, and has a program for executing dimensional measurement stored therein. In addition, the controlling unit 20 determines an accelerating voltage for the electron beam 9, and applies the accelerating voltage to the electron gun 1 electrically connected to the controlling unit 20.

Figure 2:
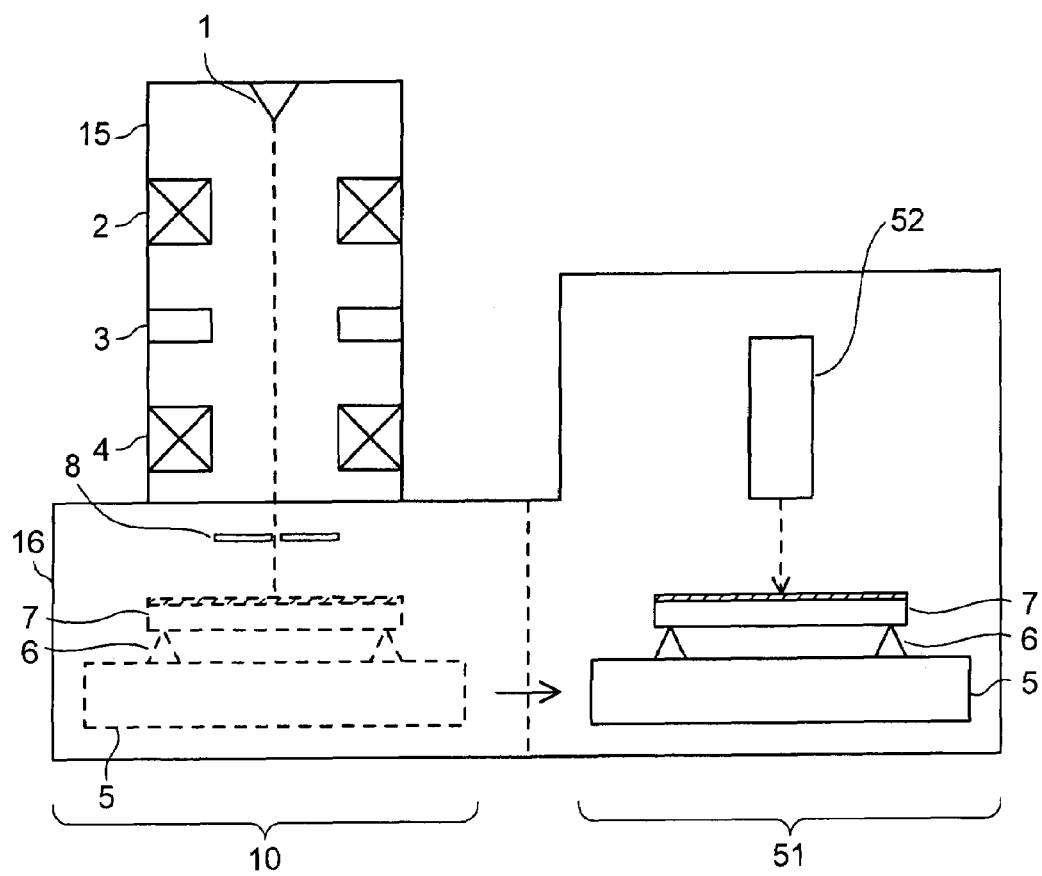
FIG. 2 is a diagram showing a distance measuring device of the electron-beam size measuring apparatus in FIG. 1.

FIG. 2 is a diagram showing the electron-beam size measuring apparatus 100 including a distance measurement chamber 51. In the distance measurement chamber 51, the height of the sample 7 above the XYZ stage 5 is measured. This measurement is carried out by using a non-contact type measuring device 52 that is not in contact with the sample 7. In the present embodiment, the distance measurement chamber 51 is provided in addition to the sample chamber 16, and the height of the sample 7 is measured after the XYZ stage 5 is moved to the distance measurement chamber 51. A CCD camera, for example, is used as the non-contact type measuring device 52, and the height of the sample 7 is measured by detecting a focal position in which the CCD camera is in focus on the sample 7 by the use of an auto focus mechanism.

Incidentally, an apparatus for measuring the height of a sample 7 is not limited to an apparatus using a CCD camera, and any measuring apparatus can be used for this as long as the apparatus does not cause an error in detection of a focal position even under the influence of the potential of a sample.

Before the sample 7 placed above the XYZ stage 5 with sample supporting unit 6 is inspected or measured in dimension in the electron-beam size measuring apparatus 100 having the foregoing configuration, conditions for an electron shower for neutralization are determined by using a calibration sample made of the same material as that of the sample 7 (hereinafter, the conditions and the shower will be simply called neutralization shower conditions and a neutralization shower, respectively). The neutralization shower conditions are ones required for a neutralization shower (electron beam irradiation) for adjusting the potential on the surface of the sample 7 to reach a constant level (0 (V), for example), and include an accelerating voltage for an electron beam, the distance (reference distance) between the surface of the sample 7 and the secondary electron control electrode, and a voltage level (reference voltage level) applied to the secondary electron control electrode. After these conditions are determined, the distance between the surface of the sample 7 and the secondary electron control electrode is set as the reference distance, and the sample 7 is subjected to a neutralization shower by applying the reference voltage to the secondary electron control electrode.

(Process for Adjusting Sample Surface Potential to be Constant)

The neutralization shower performed before an inspection or dimensional measurement of the sample 7 can adjust the potential on the surface of the sample 7 to be constant. The principle of this will be described below.

Figure 3:
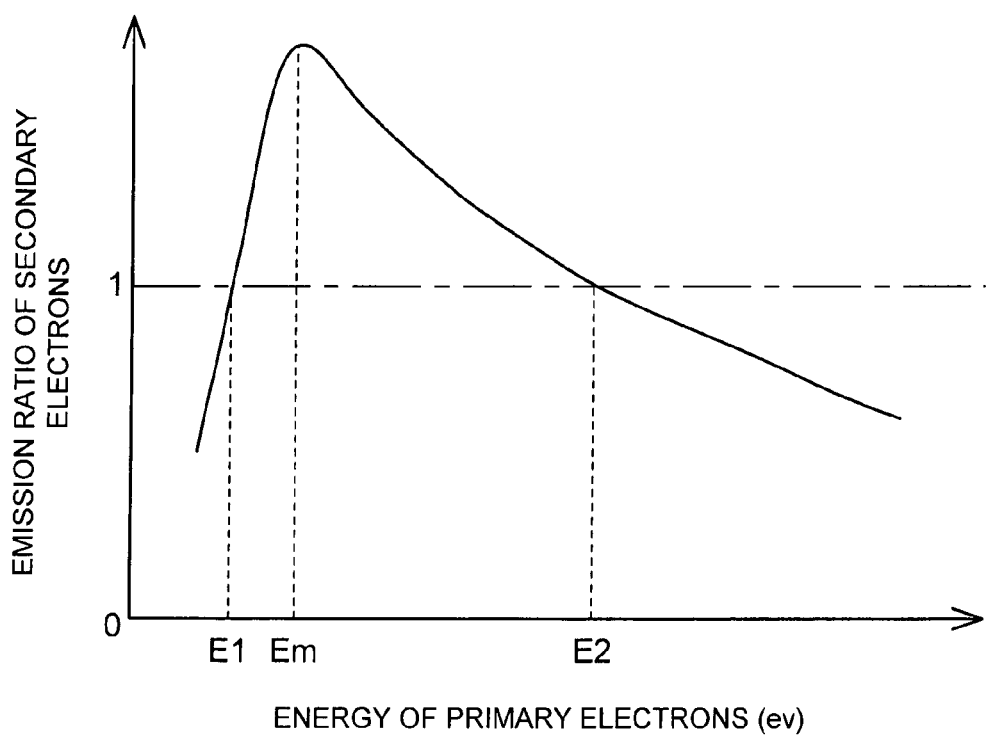
FIG. 3 is a diagram showing a relationship between energy of primary electrons and an emission ratio of secondary electrons.

FIG. 3 schematically shows a relationship between energy of primary electrons and an emission ratio of secondary electrons. As shown in FIG. 3, as the energy of primary electrons increases from a low energy level, the emission ratio of secondary electrons also increases and then reaches 1 when the energy of primary electrons is E1. When the energy of primary electrons further increases and reaches Em, the emission ratio of secondary electrons becomes the maximum. Then, when the energy of primary electrons exceeds E2, the emission ratio of secondary electrons again becomes smaller than 1. Here, the values of E1, Em and E2 change depending on a material of a sample, while the value of Em is within a range of 500 (eV) to 1000 (eV) in most cases.

Figure 4A:
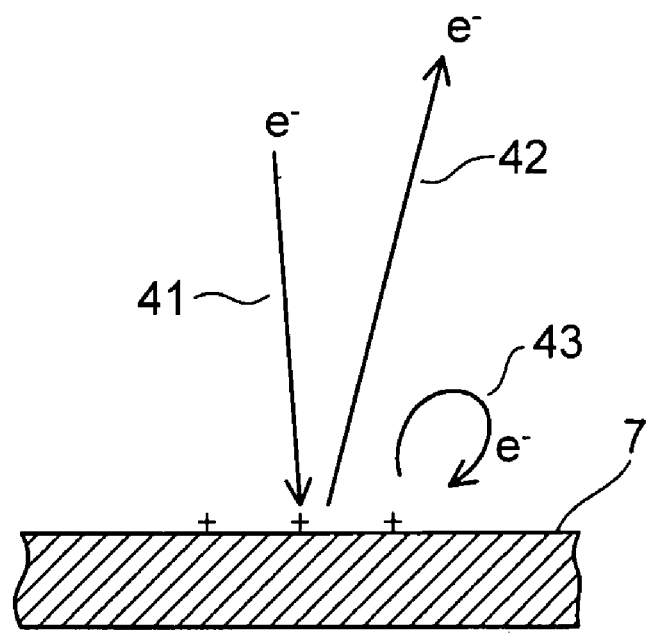
FIGS. 4A and 4B are diagrams each showing a relationship between an emission ratio of secondary electrons and the surface of a sample.
Figure 4B:
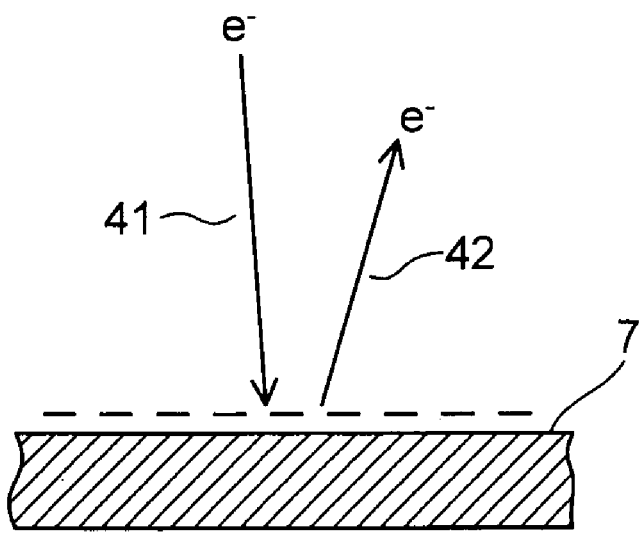

FIGS. 4A and 4B each schematically show a relationship between an emission ratio of secondary electrons and a charging status on the surface of an insulating film. FIG. 4A shows a case where the emission ratio of secondary electrons is more than 1. When the emission ratio of secondary electrons is more than 1, the surface of the sample 7 becomes positively charged since the number of secondary electrons 42 emitted from a sample 7 exceeds the number of primary electrons 41 entering the sample 7. On the other hand, FIG. 4B shows a case where the emission ratio of secondary electrons is less than 1, the case being equivalent to a case where the energy of primary electrons shown in FIG. 3 is lower than E1 or higher than E2. When the emission ratio of secondary electrons is less than 1, many electrons remain on the surface of the sample 7, and thereby the surface of the sample 7 becomes negatively charged.

When the energy of primary electrons is sufficiently large, and when the emission ratio of secondary electrons is less than 1, the primary electrons slow down around the sample 7 since the surface of the sample 7 becomes negatively charged. This charging makes a progress until the primary electrons slow down to the level corresponding to the energy of E2, and until the emission ratio of secondary electrons becomes close to 1. At this time, the charging voltage is the difference between E2 and the energy of primary electrons, and the surface of the sample 7 may sometimes be charged to have a large negative value (for example, a value smaller than −100 (V)). When such charging occurs, a secondary electron image is so largely distorted that an error in dimensional measurement increases.

On the other hand, when the emission ratio of secondary electrons is more than 1, the surface of the sample 7 becomes positively charged. However, when the surface becomes charged, a relatively large number of secondary electrons 43 having a few electron volt of energy become drawn back to the surface of the sample 7. An incident current carried by the primary electrons and the secondary electrons drawn back to the surface, and an emission current carried by the emitted secondary electrons reach equilibrium, and thereby the charging does not make progress any more. For this reason, a range in which the emission ratio of secondary electrons is more than 1 is adopted for inspecting a sample 7 and the like.

In order to obtain such equilibrium, a change in the potential of a sample surface is conventionally suppressed in such a manner that the sample surface potential is caused to become charged positively or negatively by changing the energy of irradiated electron beam. At this time, the accelerating voltage is set so as to make the emission ratio of secondary electrons be 1, and thereby to prevent the sample surface from becoming charged. However, it is difficult to set the accelerating voltage, because the accelerating voltage making generation efficiency of secondary electrons 42 be 1 differs depending on a material of a sample 7, and thereby it is necessary to find the accelerating voltage making the generation efficiency of secondary electrons be 1 while adjusting the accelerating voltage. In addition, with this method, it is difficult to control charging with accuracy of not more than 1 (V).

The present embodiment pays attention to the distance between the surface of a sample 7 and an electrode (the secondary electron control electrode 8a of the electron detector 8 in the present embodiment).

The amount of secondary electrons emitted from the surface of the sample 7 with an electron beam irradiated on the surface depends on the energy of the irradiated electron beam and force acting on the secondary electrons. This force depends on an electric field generated by a voltage applied to the secondary electron control electrode 8a. Then, the electric field is determined according to the distance (also simply referred to as "the sample-electrode distance," below) between the surface of the sample 7 and the secondary electron control electrode 8a, and to a control voltage applied to the secondary electron control electrode 8a.

Accordingly, by keeping the control voltage and the sample-electrode distance fixed, the force acting on the secondary electrons can be made constant.

Figure 5A:
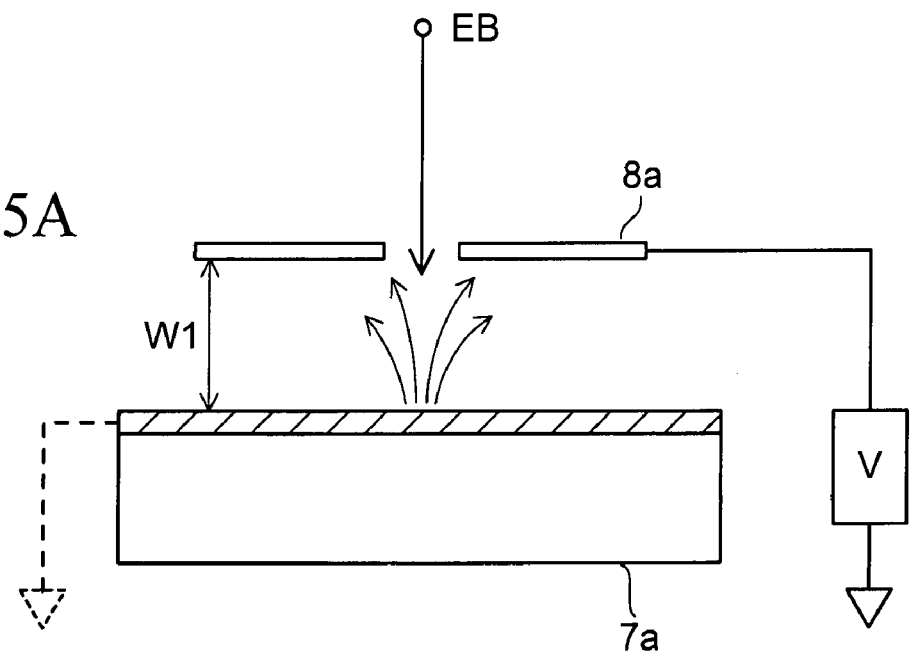
FIGS. 5A and 5B are diagrams explaining that charging of the surface of a sample depends on the distance between a sample and the secondary electron control electrode.
Figure 5B:
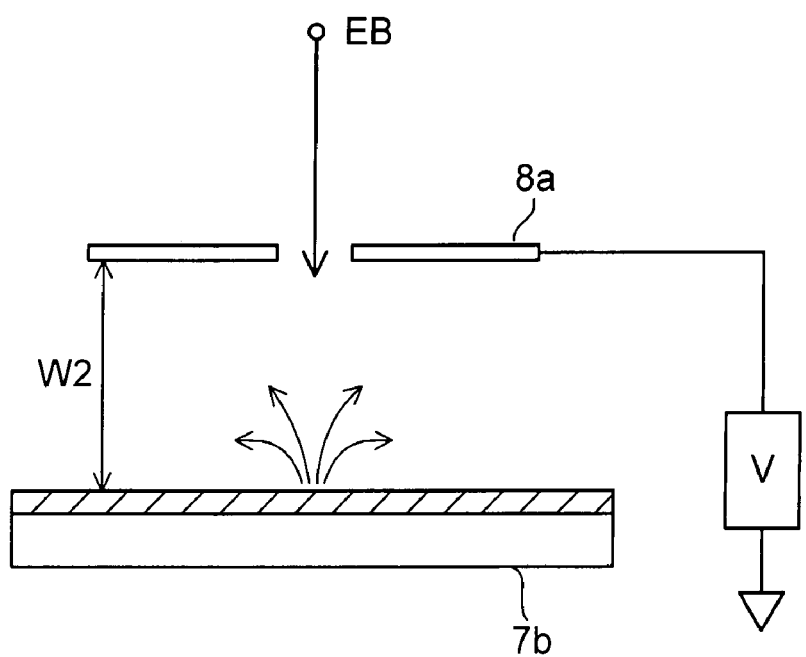

FIGS. 5A and 5B show a problem occurring in a case where the distance between the surface of the sample 7 and the secondary electron control electrode 8a is not fixed.

Suppose that the potential of the surface of a sample 7a is 0 (V) when the sample-electrode distance is W1 as shown in FIG. 5A. At this time, since the surface of the sample 7a is not charged, the sample 7a can be measured with high accuracy.

Subsequently, a dimension of another sample 7b mounted above the XYZ stage 5 is measured as shown in FIG. 5B. In FIG. 5B, since a glass substrate of the sample 7b is different in thickness from a glass substrate in FIG. 5A, the sample-electrode distance changes to be W2.

Force F acting on electrons emitted from the surface of the sample 7b is a product of a charge of the electrons and an electric field between the surface of the sample 7b and the secondary electron control electrode 8a. Accordingly, in a case of W2 (>W1), the force acting on the electrons becomes so weak that many electrons are drawn back to the sample 7b. This causes the surface of the sample 7b to become negatively charged.

On the other hand, when the sample-electrode distance and the control electrode are kept fixed, the force acting on the elections becomes constant. As a result, the amount of the electrons drawn back to the sample 7 becomes constant, and thereby the potential of the surface of the sample 7 becomes 0 (V).

When the distance between the surface of a sample and the secondary electron control electrode 8a are kept fixed as described above, the sample surface potential can be made constant by controlling the values of the control voltage applied to the secondary electron control electrode 8a and the accelerating voltage for the electron beam.

(Method for Making Sample Surface Potential Constant)

As described above, the electric field between the sample 7 and the secondary electron control electrode 8a determines whether the secondary electrons emitted from the surface of the sample 7 reach the secondary electron control electrode 8a or are drawn back to the surface of the sample 7. Accordingly, in order to cause the secondary electrons to behave uniformly, the electric filed is adjusted to be constant by maintaining fixed the voltage applied to the secondary electron control electrode 8a and the distance between the surface of the sample 7 and the secondary electron control electrode 8a.

Figure 6:
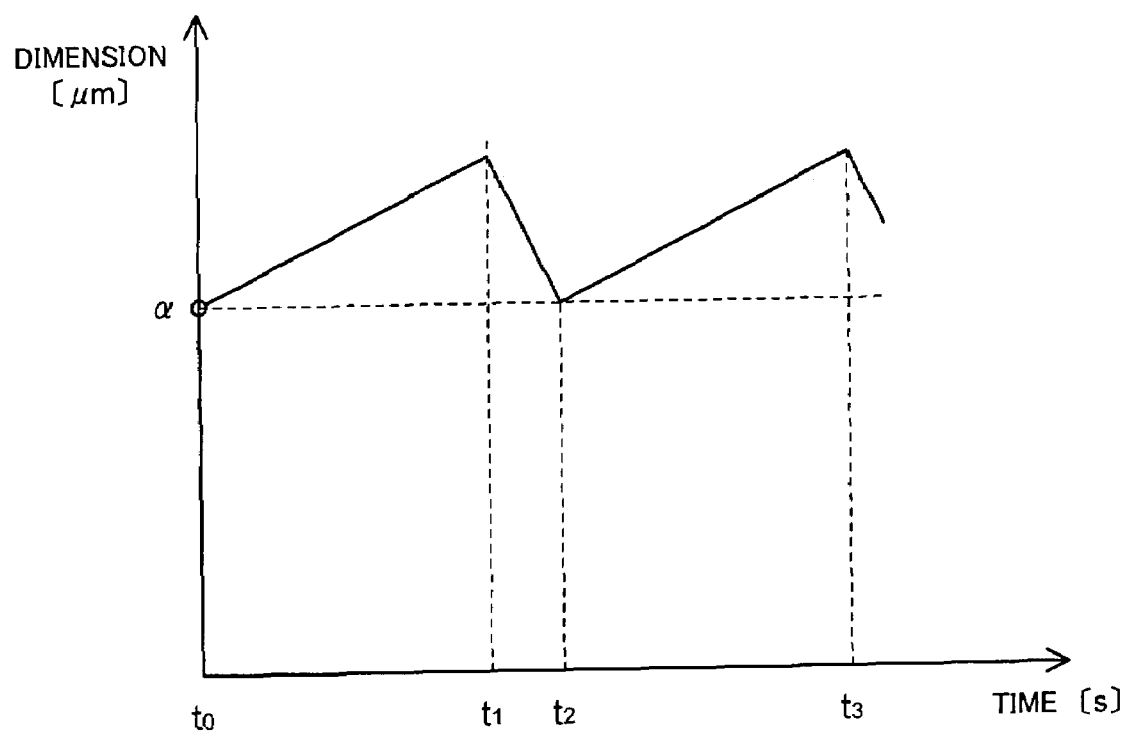
FIG. 6 is a diagram showing a time change in measured value.

FIG. 6 shows a time change in measured value of a sample at a time when the sample surface potential is not constant.

Suppose that a dimension measured at a time t0 is α. While the dimension of the sample is measured, the sample is irradiated with the electron beam. As a result, the surface of the sample becomes charged, and a trajectory of the electron beam is shifted. As shown in FIG. 6, this causes a phenomenon in which a greater value is obtained by measuring the dimension as a time passes.

For this reason, at a time t1, a neutralization shower is carried out in order to adjust the sample surface potential to be constant. This neutralization shower is performed until the current measured value becomes equal to the value measured at the time t0. In FIG. 6, the sample surface potential returns to the state at the time t0 by performing the neutralization shower until the time t2. Thereafter, the dimensional measurement and the neutralization shower are repeatedly performed for the samples.

Figure 7:
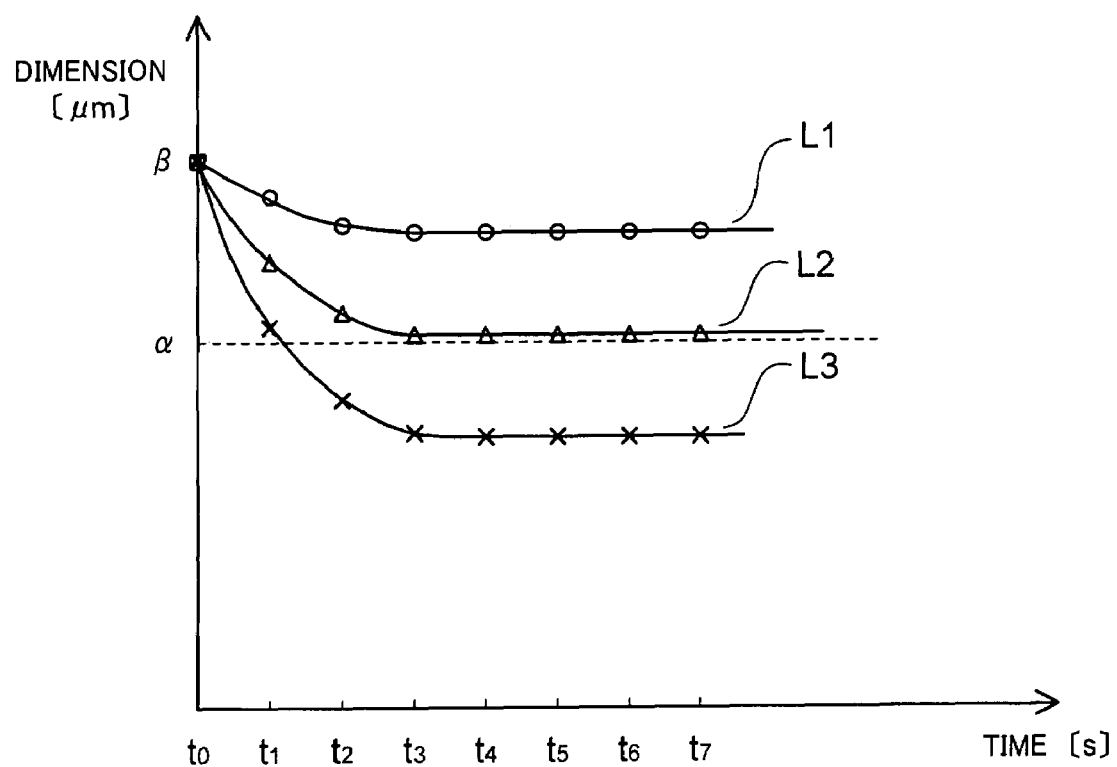
FIG. 7 is a diagram showing time changes in dimensional measurement values by using, as a parameter, a control voltage applied to the secondary electron control electrode.

FIG. 7 shows time changes in dimensional measurement values by using, as a parameter, the control voltage applied to the secondary electron control electrode 8a.

Here, assume that each of the dimensional measurement values at a time to is β. This time to corresponds to the time t1 in FIG. 6.

A predetermined voltage is applied to the secondary electron control electrode 8a from this time point, and thereby the stable measurement values are obtained. The curved line L2 in FIG. 7 indicates that the sample surface becomes at 0 (V), and that thereby the measurement value becomes α. In addition, the curved lines L1 and L3 in FIG. 7 each indicate that the sample surface becomes charged positively or negatively, and that thereby the measurement value does not become α.

Stabilization of the measured value results from a phenomenon in which charging does not progress due to the equilibrium between the incident current entering the sample and the emission current from the sample. For this reason, although the charging on the sample surface does not progress, the sample surface does not always reach 0 (V), and the measured value does not always becomes a like the curbed lines L1 and L3 in FIG. 7.

Accordingly, a control voltage that causes the sample surface potential to reach 0 (V) is found by changing the control voltage for the secondary electron control electrode 8a to change the force acting on the secondary electrons. The use of this control voltage, the accelerating voltage for the electron beam and the distance between the sample 7 and the secondary electron control electrode 8a allows the sample surface potential to reach 0 (V) while preventing the charging on the sample surface from progressing.

Figure 8:
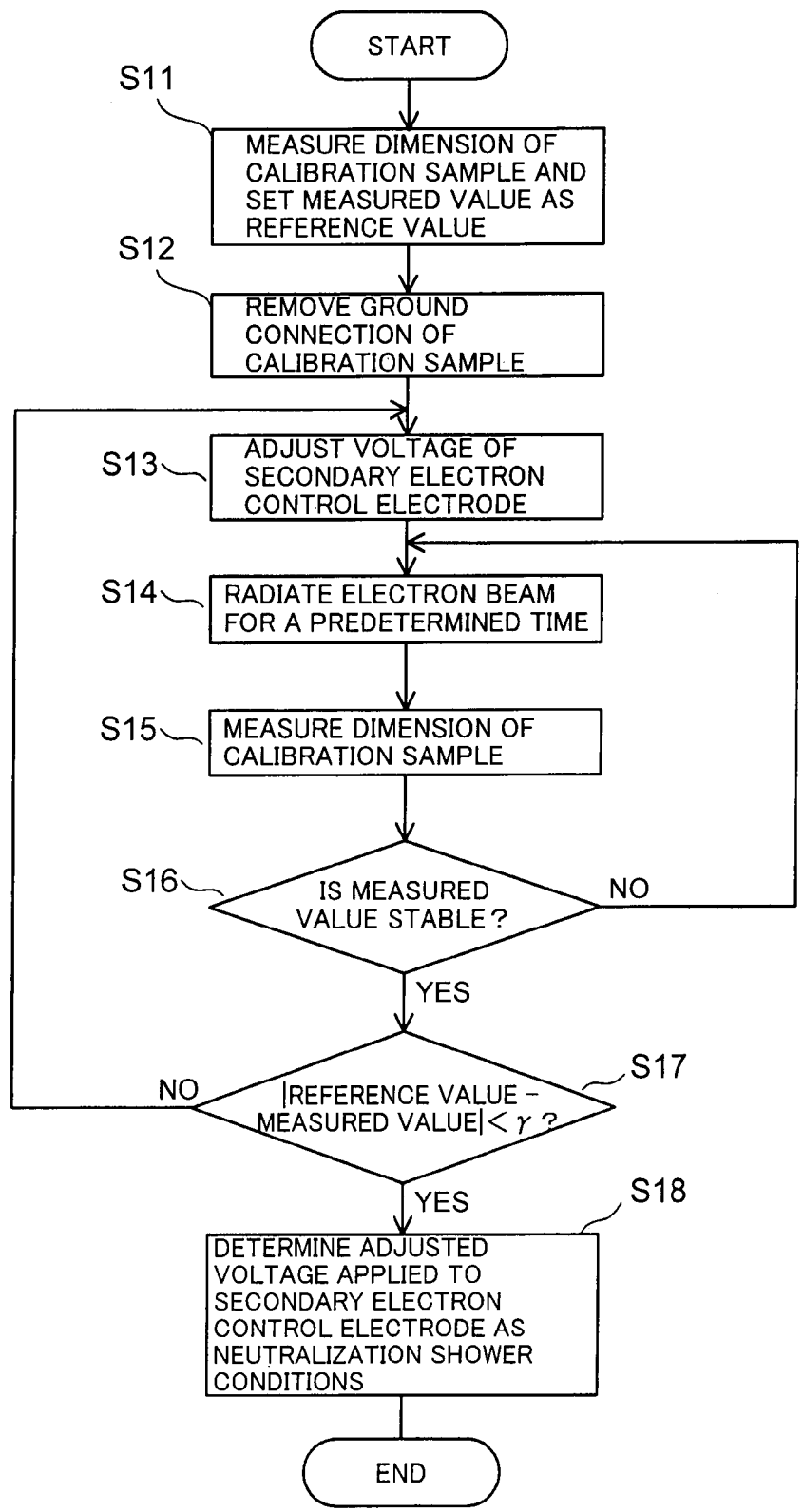
FIG. 8 is a flowchart of processing for determining the control voltage for the secondary electron control electrode.

Hereinafter, a method for determining the neutralization shower conditions will be described by using a flowchart in FIG. 8.

As preconditions for determining the neutralization shower conditions, the accelerating voltage for the electron beam, and the distance between the sample surface and the secondary electron control electrode 8a are determined in advance. For example, it is determined that the accelerating voltage is 500 (eV), and that the distance between the sample surface and the secondary electron control electrode 8a is 3 (mm).

Firstly, in step S11, a reference dimension is measured by using a calibration sample. This calibration sample is made of the same material as that of a sample 7 to be measured.

A substrate of the calibration sample is entirely composed of a conductor, and a dimension thereof is known. The sample surface potential is set to 0 (V) by grounding the calibration sample. Then, the dimension thereof is measured before the sample surface potential changes, and is set as the reference dimension. In this dimension measurement, the sample is irradiated and scanned with an electron beam, an image of the sample is obtained, and then the dimension in the obtained image is measured.

Note that the calibration sample is not limited to the one having a substrate entirely composed of a conductor, but may be one having a mechanism that can be temporarily grounded while being mounted above the stage. When a calibration sample that can be temporarily grounded while being mounted above the stage is used, a dimension used as a reference is measured in a state where the calibration sample is grounded.

In the next step S12, the ground connection of the calibration sample is removed. Once the ground connection is removed, the surface of the calibration sample starts being charged positively or negatively.

In the next step S13, the voltage applied to the secondary electron control electrode is set to a predetermined value, for example, −50 (V).

In the next step S14, the sample is irradiated with an electron beam for a predetermined time, for example, 10 seconds by applying the predetermined voltage to the secondary electron control electrode.

In the next step S15, an electron microscope image of the sample is obtained, and then the dimension of the calibration sample is measured. A voltage applied to the secondary electron control electrode during the dimensional measurement of the calibration sample is different from the value adjusted in step S13 and determined in step S18, and is set to a voltage value suitable for the dimensional measurement having sufficiently high resolution of the electron beam and achieving high secondary electron capturing efficiency.

In the next step S16, a judgment is made as to whether or not the measured value of the calibration sample becomes stable. The dimension of the calibration sample is measured in step S15, after the sample is irradiated with the electron beam for a predetermined time n from the time t=0 in step S14. As a result, the measuring times are t=n, 2n, 3n, . . . . For example, the measured value is judged as being stable when the difference between the measured values at the time 2n and the time 3n, for example, becomes smaller than a predetermined value, for example, 0.1 (nm)

When the measured value is judged as being stable, this measured value is determined as the measured value under the control voltage set in step S13, and then the processing moves to step S17. When the measured value is judged as not being stable, the processing moves back to step S14, and the dimensional measurement is continued by further irradiating an electron beam on the sample.

In the next step S17, the measured value and the reference value obtained in step S11 are compared with each other. The difference (called D) between the measured value and the reference value is figured out, and a judgment is made as to whether or not D is smaller than a predetermined value, for example, 0.2 (nm). When D is judged as being smaller than the predetermined value, the processing moves to step S18.

On the other hand, when D is judged as being larger than the predetermined value, the processing moves to step S13. Then, a voltage different from the pervious processing is applied to the secondary electron control electrode, and thereby the processing is continued.

In the next step S18, the voltage set in step S13 to be applied to the secondary electron control electrode is determined as the reference voltage, and then the processing is finished.

Note that, although an irradiation area of a sample with a neutralization shower basically includes an area to be measured, the neutralization shower may be performed on only a certain portion detected as a position to which a conductor on the sample is exposed, by using a CAD, a reflected electron image and the like.

In addition, the material of a calibration sample is desirable to be the same material of a sample to be measured, but even a different material can be used as long as the material has the same dimensional relationship under the same neutralization shower conditions. The present inventor found out that Si and Cr have the same dimensional relationship under the same neutralization shower conditions.

(Size Measuring Method with Electron Beams)

Figure 9:
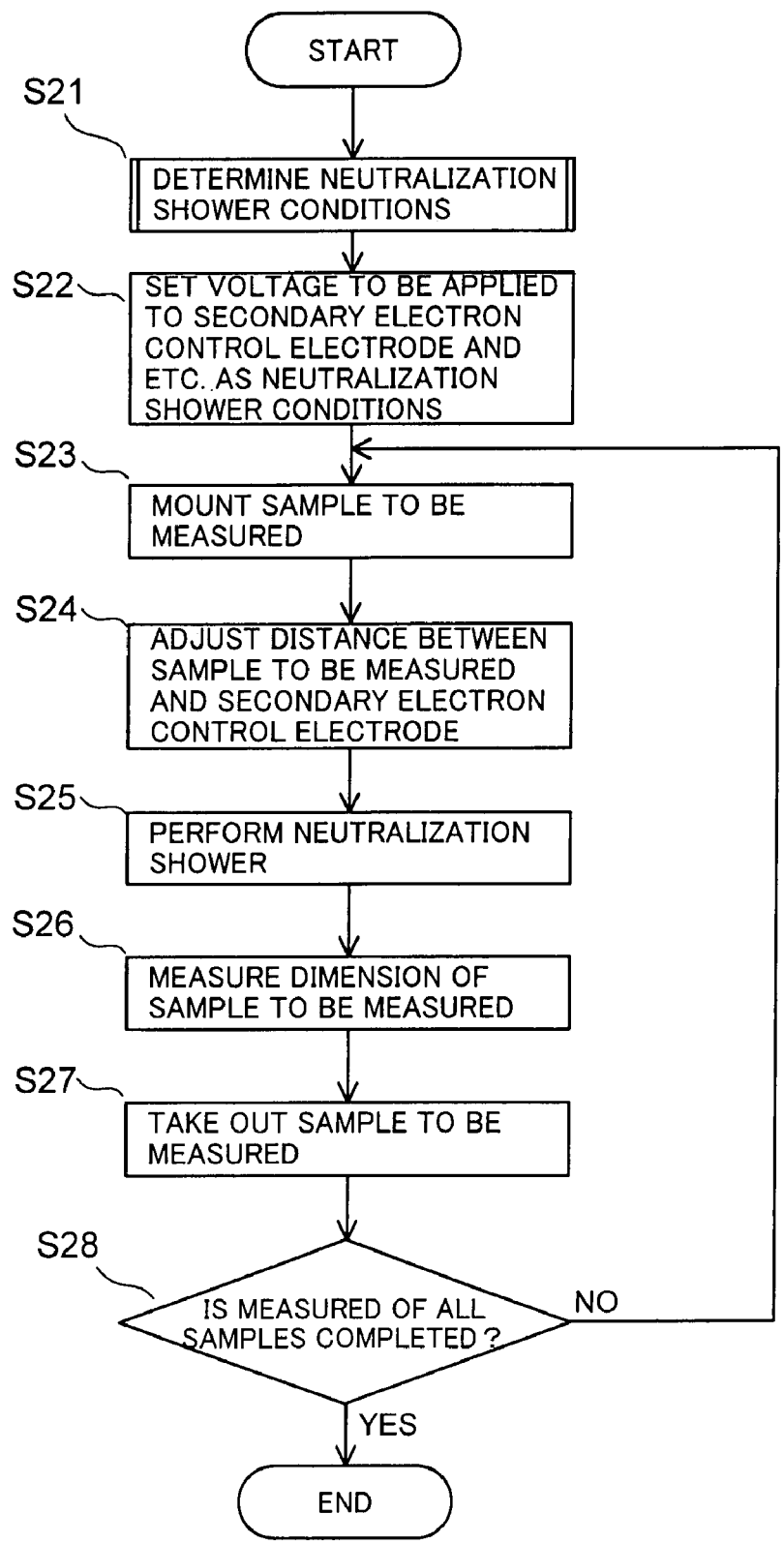
FIG. 9 is a flowchart showing a size measuring method with electron beams.

Hereinafter, with reference to FIG. 9, descriptions will be given of a method for measuring a dimension of a sample 7 with the potential of the surface of the sample 7 kept constant by using the electron-beam size measuring apparatus 100 of the present invention.

Firstly, in step S21, the neutralization shower conditions are determined. These conditions are determined with the method described by using FIG. 8.

In the next step S22, the accelerating voltage for an electron beam and the voltage to be applied to the secondary electron control electrode are set to the values of the neutralization shower conditions determined in step S21.

In the next step S23, the sample 7 is mounted above the XYZ stage 5 in the sample chamber 16.

In the next step S24, the XYZ stage 5 is moved to the distance measurement chamber 51, and then the height of the sample 7 mounted above the XYZ stage 5 is measured. The height is adjusted by moving the XYZ stage 5 up or down (in a Z direction) so that the distance between the sample 7 and the secondary electron control electrode 8a would be equal to the predetermined certain distance. Thereafter, the XYZ stage 5 is moved from the distance measurement chamber 51 to the sample chamber 16.

In the next step S25, a neutralization shower is carried out. The duration when the neutralization shower is performed is a time period needed until the measured value has become stable when the neutralization shower conditions have been determined. Moreover, in terms of the area irradiated with the neutralization shower, an electron beam may be irradiated on the entire surface of the sample, or may be irradiated on a part to which the conductor on the sample is exposed. The part to which the conductor on the sample is exposed is detected by using CAD data, for example.

In the next step S26, the dimension of the sample is measured with the surface of the sample not charged after the neutralization shower is carried out. During the measurement of the dimension of the sample, the voltage applied to the secondary electron control electrode is different from the voltage determined in step S21, and is set to a voltage value suitable for the dimensional measurement having sufficiently high resolution of the electron beam and achieving high secondary electron capturing efficiency All the dimensional measurement points in the sample are measured by repeating steps S24 to S26.

Incidentally, when the height of the entire surface of the sample is changed only to a small extent, only steps S25 and S26 can be repeated for measurement.

In the next step S27, the sample 7 after the dimensional measurement is taken out from the sample chamber 16.

In the next step S28, a judgment is made as to whether or not the dimensional measurement of all the samples is completed. If not completed, the processing moves back to step S23, and the dimensional measurement is continued.

As described above, in the measuring method using the electron-beam size measuring apparatus of the present embodiment, the potential on a sample is made constant before the dimensional measurement of the sample. In order to make the potential constant, found are the control voltage applied to the secondary electron control electrode and the accelerating voltage for an electron beam at a time when the distance between the surface of the sample and the secondary electron control electrode is kept fixed. By carrying out a neutralization shower on the sample under these neutralization shower conditions, the potential on the surface of the sample becomes constant at 0 (V). Accordingly, an area irradiated by an electron beam is not changed, unlike a case where the electron beam is influenced by a different level of the potential on the sample. As a result, a stable measurement can be carried out.

Note that, although the processing of adjusting a sample surface potential to be constant is carried out every time the sample is measured in the present embodiment, the measuring method of the present embodiment is not limited to this, and this process may be carried out only when the sample surface potential needs to be adjusted to be constant. For example, a neutralization shower may be carried out every 5 times of the dimensional measurement.

In addition, a beam irradiation amount may be increased by setting an electron beam, which is irradiated to adjust the potential to be constant, to have a high current. Although the time period needed until the measured value becomes stable is found by irradiating an electron beam of the predetermined accelerating voltage when the neutralization shower conditions are found, the time needed until the potential becomes constant can be shortened by increasing an irradiation amount of beam with the accelerating voltage set to a value equivalent to Em in FIG. 3.

EXAMPLE

Hereinafter, descriptions will be given for a measurement result of a dimension on the sample 7 by using the electron-beam size measuring apparatus 100 of the present embodiment.

Figure 10A:
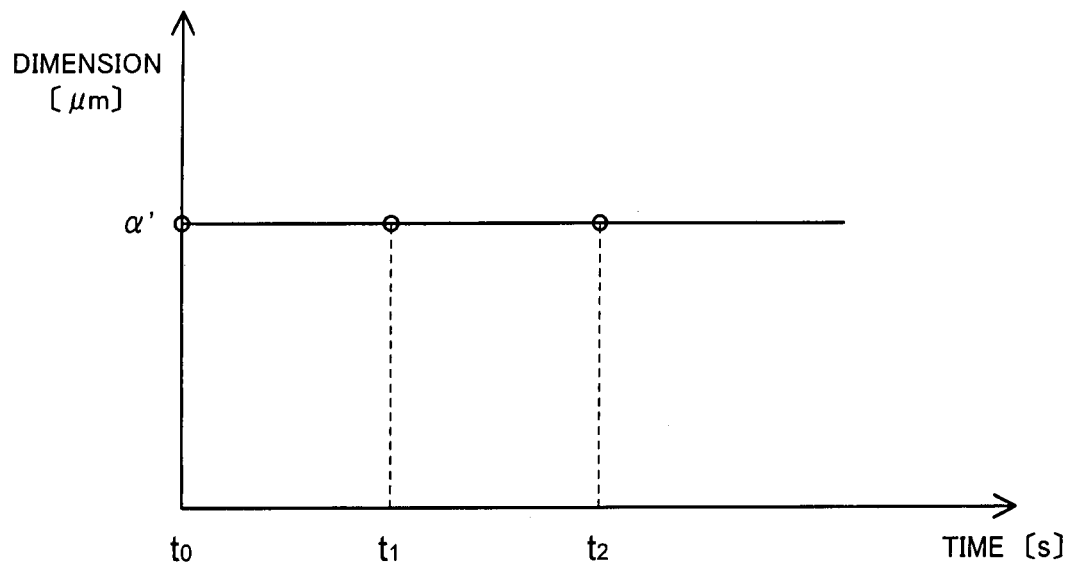
FIG. 10A shows a dimensional measurement result at a time when the distance between the sample and the secondary electron control electrode was kept fixed.
Figure 10B:
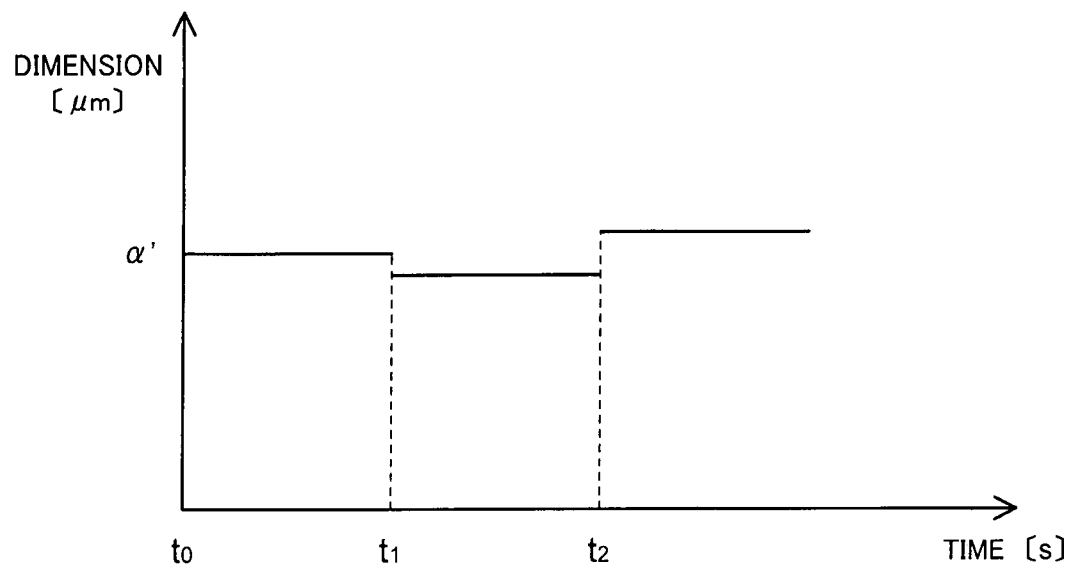
FIG. 10B shows a dimensional measurement result at a time when the distance between the sample and the secondary electron control electrode was not kept fixed.

FIG. 10A shows a dimensional measurement result at a time when the distance between the sample and the secondary electron control electrode was kept fixed. FIG. 10B shows a dimensional measurement result at a time when the distance between the sample and the secondary electron control electrode was not kept fixed.

In this example, targeting at a case where the material of a sample is chrome, the neutralization shower conditions (the distance between the surface of a sample and the secondary electron control electrode, the accelerating voltage for an electron beam, and a voltage applied to the secondary electron control electrode) were measured, and the values of 3 (mm), 500 (V) and −50 (V) were found, respectively.

The time points t1 and t2 in FIG. 10A each indicate a time point when a sample whose dimension is to be measured is changed to another one. As is clear from FIG. 10A, the dimensional measured value (α') was not changed when the samples were measured in dimension while neutralization showers were carried out under the neutralization shower conditions, and while adjusting the distance between the surfaces of, the samples and the secondary electron control electrode even when the heights of the samples were different from each other. In this way, a dimensional measurement can be performed with high accuracy by using the electron-beam size measuring apparatus of the present embodiment.

On the other hand, for the purpose of comparing the case using the size measuring method with electron beams of the present embodiment, FIG. 10B shows a result of the dimensional measurements in the following manner. Specifically, the accelerating voltage for the electron beam and the voltage applied to secondary electron control electrode were set to the same values as those in the case of the present embodiment. However, the samples were measured in dimension while the neutralization showers were carried out without adjusting the distance between the surfaces of the samples and the secondary electron control electrode to be constant.

As can be understood from FIG. 10B, the measurement result is changed due to a difference in the height between the samples at the times (time points t1 and t2) when the samples were changed. This result shows that a change in the distance between the surfaces of the samples and the secondary electron control electrode causes an error in the dimensional measurement.

Note that, in this example, it was observed in the experiment that an error of approximately 1 (nm) in the measurement of a dimension of 2 ($\mu$m) was measured in a case where the height of a sample is changed by 300 ($\mu$m).

What is claimed is:

1. An electron-beam size measuring apparatus comprising:
   electron beam irradiating means that irradiates an electron beam on a surface of a sample;
   detection means that detects electrons emitted from the sample;
   distance measurement means that measures the distance between the sample and a secondary electron control electrode of the detection means;
   a stage on which the sample is mounted; and
   control means which adjusts the height of the stage so that the distance measured by the distance measurement means would be equal to a predetermined fixed distance, which applies a control voltage to the secondary electron control electrode of the detection means, the control voltage predetermined so as to allow the sample surface potential to become constant level when the sample is positioned at the fixed distance, and which causes the electron beam to be irradiated by applying a predetermined accelerating voltage.

2. The electron-beam size measuring apparatus according to claim 1, wherein the control voltage is a voltage at a time when a first measured value and a second measured value are equal to each other, the first measured value obtained by measuring a dimension of a calibration sample with the surface thereof not charged, the calibration sample made of the same material as that of the sample, and the second measured value being a value at a time when the measured value of the calibration sample does not vary any more, while the calibration sample is irradiated with the electron beam and is measured in dimension, alternately, from a state in which the surface of the calibration sample is charged at the beginning.

3. The electron-beam size measuring apparatus according to claim 1, wherein the stage includes holding means that does not electrically connect the sample thereto, and moving means that moves the sample up and down.

4. The electron-beam size measuring apparatus according to claim 1, wherein the control means causes the electron beam irradiating means to irradiate the entire surface of the sample with the electron beam.

5. The electron-beam size measuring apparatus according to claim 1, wherein the control means causes the electron beam irradiating means to irradiate, with the electron beam, an area to which a conductor on the sample is exposed.

6. The electron-beam size measuring apparatus according to claim 1, wherein the control means causes the electron beam irradiating means to adjust an electron irradiation amount of the electron beam to be larger than an irradiation amount of electrons at a time of measuring a dimension.

7. The electron-beam size measuring apparatus according to claim 1, wherein the control means measures a dimension of the sample after adjusting the potential of the surface of the sample to a fixed level.

8. A size measuring method with electron beams comprising the steps of:

figuring out a control voltage to be applied to a secondary electron control electrode for adjusting the charge potential of the sample to become constant when the distance between a sample and the secondary electron control electrode is kept fixed, and also when an accelerating voltage for an electron beam to be irradiated on the sample is set to a predetermined value;

adjusting the distance between the sample and the secondary electron control electrode to be the predetermined distance;

irradiating the sample with an electron beam at the accelerating voltage by applying the control voltage to the secondary electron control electrode; and measuring a dimension of the sample after irradiating the electron beam.

9. The size measuring method with electron beams according to claim 8, wherein the control voltage is a voltage at a time when a first measured value and a second measured value are equal to each other, the first measured value obtained by measuring a dimension of a calibration sample with the surface thereof not charged, the calibration sample made of the same material as that of the sample, and the second measured value being a value at a time when the measured value of the calibration sample does not vary any more, while the calibration sample is irradiated with the electron beam and is measured in dimension, alternately, from a state in which the surface of the calibration sample is charged at the beginning.

10. The size measuring method with electron beams according to claim 8, wherein the electron beam is irradiated on the entire surface of the sample.

11. The size measuring method with electron beams according to claim 8, wherein the electron beam is irradiated on an area to which a conductor on the sample is exposed.

12. The size measuring method with electron beams according to claim 8, wherein an electron irradiation amount of the electron beam is larger than an irradiation amount of electrons at a time of measuring a dimension.

* * * * *